United States Patent [19]

Hachiya

[11] Patent Number: 5,757,704
[45] Date of Patent: May 26, 1998

[54] SEMICONDUCTOR MEMORY INTEGRATED CIRCUIT WITH SIMPLIFIED CIRCUIT STRUCTURE

[75] Inventor: Yutaro Hachiya, Tokyo, Japan

[73] Assignee: NEC Corporation, Japan

[21] Appl. No.: 881,025

[22] Filed: Jun. 23, 1997

[30] Foreign Application Priority Data

Jul. 30, 1996 [JP] Japan ................. 8-200643

[51] Int. Cl.$^6$ ................................. G11C 7/00
[52] U.S. Cl. .................. 365/189.07; 365/189.02; 365/189.05
[58] Field of Search ................. 365/189.07, 189.02, 365/189.05, 230.08, 230.02, 189.01, 233

[56] References Cited

U.S. PATENT DOCUMENTS

| | | | |
|---|---|---|---|
| 5,321,651 | 6/1994 | Monk | 365/230.02 |
| 5,404,480 | 4/1995 | Suzuki | 365/189.07 |
| 5,467,457 | 11/1995 | Kohda et al. | 365/189.07 |
| 5,717,653 | 2/1998 | Suzuki | 365/189.07 |

FOREIGN PATENT DOCUMENTS 4105298  4/1992  Japan ................. G11C 11/34

*Primary Examiner*—Tan T. Nguyen
*Attorney, Agent, or Firm*—Hayes, Soloway, Hennessey Grossman & Hage, P.C.

[57] ABSTRACT

In a semiconductor memory device, an first address register stores an inputted address and a second address register stores a write address for a write data. A comparing circuit compares both of the stored addresses, and generates a coincidence signal in accordance with the comparing result. A memory cell array composed of a plurality of memory cells. A write data register stores the write data. A data output register selectively receives, one of the write data from the write data register and a read data from the memory cell array as a selected data in response to the control signal and a register clock signal. Then, the data output register outputs the selected data in response to the register clock signal.

20 Claims, 7 Drawing Sheets

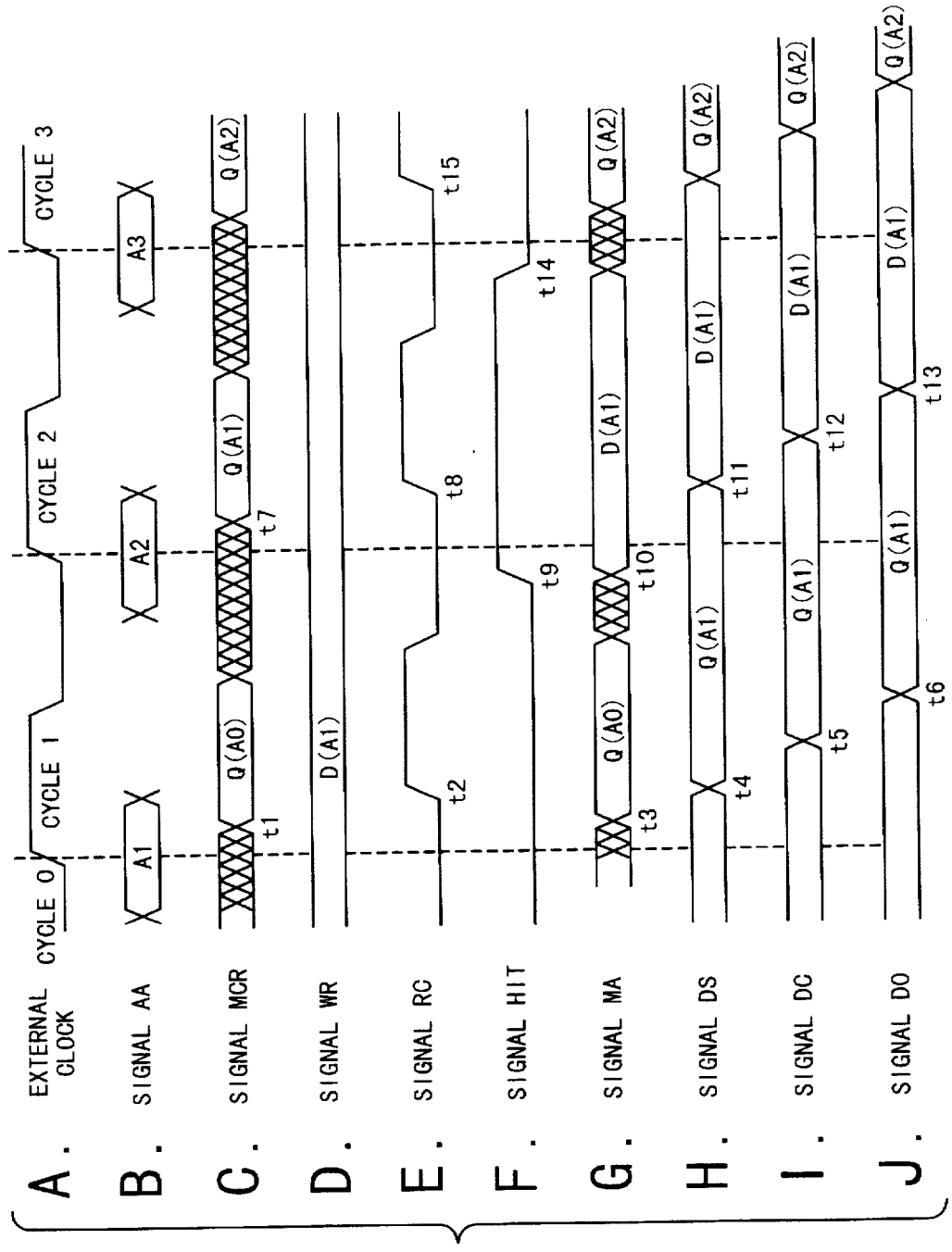

SEMICONDUCTOR MEMORY INTEGRATED CIRCUIT WITH SIMPLIFIED CIRCUIT STRUCTURE

BACKGROUND OF THE INVENTION

1. Field of the Invention

The present invention relates to a semiconductor memory integrated circuit, and more particularly to a synchronous-type semiconductor memory integrated circuit which has a late write function.

2. Description of the Related Art

As a type of semiconductor memory integrated circuit, there is known a synchronous-type semiconductor memory integrated circuit which can operate with a high clock frequency equal to or more than 100 MHz. In such a semiconductor memory integrated circuit, a write method so-called a late write method is recently adopted. In the late write method, a write operation is not completed to a stable potential level of a memory cell in a single write cycle. In this case, therefore, in order to pretend as if the write operation is completed in the single write cycle, a write data is temporarily stored in a register. Therefore, there is a case that the next read operation cycle is started before completion of the write operation. If the memory cell is accessed before the write operation to the memory cell completes, the data is directly read out from the register.

FIG. 1 is a block diagram illustrating a read section of a first conventional semiconductor memory integrated circuit having a late write function. Referring to FIG. 1, the first conventional semiconductor memory integrated circuit is composed of an address input register 11, a write address register 12, a comparing circuit 14, an access circuit 20, a memory cell array 13, a write data register 18, a read data register 35, a sense amplifying and level converting circuit 31, a read data register 34, a multiplexer 36, an input buffer 19, and an output buffer 17.

The address input register 11 temporarily holds an input address and the write address register 12 temporarily holds an input write address. The comparing circuit 14 compares the content of the address input register 11 and that of the write address register 12 to generate an active coincidence signal HIT when both of the contents are coincident with each other. The memory cell array 13 composed of a plurality of memory cells which are arranged in a matrix manner and store a read data. The access circuit 20 accesses the memory cell array 13 based on the input address stored in the address input register 11.

The sense amplifying and level converting circuit 31 amplifies the read data having a small amplitude from the memory cell array 13 and converts the amplified read data into a MOS level. The read data register 34 stores the read data from the sense amplifying and level converting circuit 31. The write data register 18 stores a write data. The read data register 35 stores the write data from the write data register 18. The multiplexer 36 selectively outputs one of the read data stored in the read data registers 34 and the write data stored in the read data register 35.

FIG. 2 is a block diagram illustrating the structure of the read data register 34. Referring to FIG. 2, the read data register 34 is composed of a master circuit 341 and a slave circuit 342. The master circuit 341 takes the read data therein in response to a register clock RC and outputs a master data MA to the slave circuit. The slave circuit 342 takes the master data MA therein in response to an inverted signal BRC of the register clock signal RC to hold the master data MA.

Next, the operation of the first conventional semiconductor memory integrated circuit will be described with reference to FIGS. 1 and 2. In this first conventional semiconductor memory integrated circuit, a write operation to a memory cell is completed using twice write cycles for a high-speed operation. In the first write cycle, a write address and a write data are taken in and held in the write address register 12 and the write data register 18, respectively. The write operation of the write data into a memory cell of the memory cell array 13 designated by the write address is executed in the second write cycle using the write address and the write data which are stored in the registers 12 and 35. At the same time, a new write address and a new write data are taken and held in the write address register 12 and the write data register 18, respectively.

In the above state, it is assumed that a read operation is performed to the write address which has been taken in the write address register 12, in one of read cycles between these two write cycles. In this case, not the memory cell having the write address in which an old wrong data is stored but the write data register 18 which stores a new correct data needs to be accessed.

The operation of the first conventional semiconductor memory integrated circuit will be described in more detail with reference to timing charts of FIGS. 3A to 3K in addition to FIGS. 1 and 2. First, a normal read operation from a memory cell of the memory cell array 13 having an address (A0) and storing a data Q(A0) will be described. In this case, it is assumed that a write address A1 and a write data D(A1) are taken in the write address register 12 and the write data register 18 in the first write cycle, respectively.

The effective data Q(A0) from the memory cell of the address A0 is read in a cycle 0 and appears at the sense amplifying and level converting circuit 31 on a signal line MCR in a time t201, as shown in FIG. 3C. After the amplification and level conversion by the sense amplifying and level converting circuit 31, the read data Q(A0) is outputted to the read data register 34 on a signal line D2 in a time t202, as shown in FIG. 3D. In response to a register clock RC shown in FIG. 3E, the read data Q(A0) is outputted to the multiplexer 36 on a signal line D4 in a time t203, as shown in FIG. 3G.

In this case, because the address (A0) of the address input register 11 and the write address (A1) of the write address register 12 are not coincident with each other, the coincidence signal HIT is not generated from the comparing circuit 14, as shown in FIG. 3L. Therefore, the multiplexer 36 selects the read data Q(A0) from the memory cell array 13 and outputs onto a signal line D6 in a time t204, as shown in FIG. 3J. In a time t205, the output buffer 17 outputs this read data Q(A0) to the input/output pins TI.

Next, a read operation from the write data register 18 will be described. In this case, the latest data is not yet written in a memory cell of the memory cell array 13 having the address A1 in the first write cycle. The correct data is stored in the write data register 18. The write data is transferred to the read data register 35 and held therein in response to the register clock signal RC. Regardless of this, access to the memory cell of the memory cell array 13 of the address A1 is performed.

The read data Q(A1) from the memory cell array 13 appears to the sense amplifying and level converting circuit 31 on the signal line MCR in a time t206, as shown in FIG. 3C. The amplification and level conversion are performed and the read data Q(A1) is outputted to the read data register 34 on the signal line D2 in a time t207, as shown in FIG. 3D.

The read data Q(A1) is outputted to the multiplexer 36 on the signal line D4 in a time t208 in response to the register clock RC, as shown in FIG. 3G.

In this case, the input address (A1) of the address input register 11 and the write address (A1) of the write address register 12 are coincident with each other. As a result, the coincidence signal HIT is generated from the comparing circuit 14 and is supplied to the multiplexer 36 in a time t209, as shown in FIG. 3I. This time t209 receives a constraint and it is necessary to be set such that the output data Q(A1) of the read data register 34 onto the signal line D4 is not outputted to the output buffer 17.

The multiplexer 36 selects the write data D(A1) from the write data register 18 via the read data register 35 in response to the coincidence signal HIT and outputs the write data onto the signal line D6 in a time t210, as shown in FIG. 3J. In a time t211, the output buffer 17 outputs this data D(A1) to the input/output pins TI, as shown in FIG. 3K.

In this case, the timing of the coincidence signal HIT, which is supplied from the comparing circuit 14 to control the multiplexer 36, and the timing of the register clock signal RC, which is used to output the read data from the read data register 34 to the multiplexer 36, need to be set or controlled such that bad influence to an access time and an effective data width can be suppressed as low as possible.

The times t209 and t215 of the coincidence signal HIT must satisfy the following relation to the times t208 and t214 of the read data output D4 from the slave circuit 342 of the read data register 34.

$$t209 \leq t208 \text{ and } t215 \geq t214 \quad (1)$$

It is ideally desirable that the following relation is satisfied, because the influence to the effective data width and the access time can be eliminated.

$$t209=t208 \text{ and } t215=t214 \quad (2)$$

However, considering a temperature margin and a voltage margin, this timing setting is very difficult. In other words, the change of the effective data width and the delay of the access time have been necessarily accompanied because of these margins.

That is, in the semiconductor memory integrated circuit which can perform a high-speed operation, in a case where a read operation is performed when a write operation to a memory cell address of the memory cell array is not completed, the memory cell address is detected and the coincidence signal is generated. The old erroneous data which is read out from the memory cell address of the memory cell array 13 is blocked off on the read path. The new correct data which is held in the write data register 18 is selected and is output to the input/output pins TI through the output buffer 17. In the read operation which the addresses are not coincident with each other, because the coincidence signal HIT is not generated, the read operation from the write data register 18 is not performed. The read data from the memory cell array 13 is outputted just as it is.

Also, a second conventional semiconductor memory integrated circuit is disclosed in Japanese Laid Open Patent Disclosure (JP-A-Heisei 4-105298) which describes the basic viewpoint of such a semiconductor memory integrated circuit. The second conventional semiconductor memory integrated circuit is composed of one or more sets of address register and data register for taking a write address and a write data therein in a write operation, respectively, a comparing circuit for comparing a held write address and an input address in a read operation, and a data switching circuit for outputting the write data from the above data register to an output buffer instead of a data from a memory cell in response to a coincidence signal from the comparing circuit.

By that, the content of the data register is outputted during a period until the potential of the memory cell to which the write operation is performed for a short write time is stable. It has the effect that the high-speed write operation can be achieved, when seen from the external.

Assuming that the read time is 1T, such a semiconductor memory integrated circuit can be used to operate with the read time or write time of 1T although an actual write time of 2T is necessary.

In the above mentioned first and second conventional semiconductor memory integrated circuit, the read data register controlled in accordance with the register clock signal RC and a multiplexer controlled in accordance with the coincidence signal from the comparing circuit are different circuit blocks. Therefore, it is difficult to adjust the timing of the coincidence signal and the timing of the register clock signal, considering a temperature margin and a voltage margin. As a result, it is difficult to suppress bad influence to an access time and an effective data width as low as possible.

Also, the register clock signal is used to control many registers. Thus, it is necessary to increase the drive capability of the register clock signal. This increases the chip area and a consumption current. Therefore, there is a problem in that this tendency becomes increasingly more conspicuous in a numerous bit system which is the mainstream of the synchronous-type memory circuit.

SUMMARY OF THE INVENTION

The present invention is made in the light of the above circumstances. An object of the present invention is to provide a semiconductor memory integrated circuit which has a simplified circuit structure.

Another object of the present invention is to provide a method of reading a data which timing adjustment between a coincidence signal and a register clock signal is easy without increasing the drive capability of the register clock signal, and a semiconductor memory integrated circuit for the method.

In order to achieve an aspect of the present invention, a semiconductor memory device includes an first address register for storing an inputted address, a second address register for storing a write address for a write data, a comparing circuit for comparing the inputted address stored in the first address register and the write address stored in the second address register, and for generating a coincidence signal as a control signal in accordance with the comparing result, a memory cell array composed of a plurality of memory cells, a write data register for storing the write data, and a data output register for selectively receiving, as a selected data, one of the write data from the write data register and a read data from the memory cell array in response to the control signal and a register clock signal, and for outputting the selected data in response to the register clock signal.

Here, the data output register includes a sense amplifier function to amplify the read data from the memory cell array. In this case, the data output register may include a differential transistor pair composed of a pair of bipolar transistors whose collectors are connected to a first power supply line, whose bases receive complimentary signals of the read data, and whose emitter are connected in common to each other.

The comparing circuit may generate the control signal in an active level when the inputted address stored in the first address register and the write address stored in the second address register are coincident with each other, and the control signal in an inactive level otherwise. In this case, the data output register may include a selecting circuit for selecting one of the write data and the read data in response to the control signal. In this case, the data output register may include a first circuit section for receiving the read data, a second circuit section for receiving the write data, a first MOS transistor connected to the first circuit section and set to a conductive state when the control signal is in the inactive level and to a non-conductive state when the control signal is in the active level, and a second MOS transistor connected to the second circuit section and set to a conductive state when the control signal is in the active level and to a non-conductive state when the control signal is in the inactive level.

Alternatively, the data output register may include a data holding circuit for holding and outputting the selected data in response to the register clock signal. In this case, the data output register includes a selecting circuit for selecting one of the write data and the read data in response to the control signal, an enabling section for enabling the selecting circuit to select one of the write data and the read data in response to the control signal when the register clock signal is in an inactive level, and a holding section for holding the selected data in response to the register clock signal in an active level.

Instead, the data output register may include a master circuit for selectively receiving one of the write data and the read data as the selected data in response to the control signal and the register clock signal in an inactive level, and holding the selected data in response to the register clock signal in an active level, and a slave circuit for holding the selected data from the master circuit in response to transition of the register clock signal to an active level. In this case, the control signal is desirably set to an active level before the corresponding register clock signal is set to the active level when the inputted address and the write address are coincident with each other, and the control signal is desirably reset to an inactive level before the register clock signal next to the corresponding register clock signal is set to the active level. In this case, the master circuit includes first and second bipolar transistors whose bases respectively receive complimentary signals of the read data, whose collectors are respectively connected to a power supply line via resistors, and which emitters are connected to a common emitter node, first and second MOS transistors whose gates respectively receive complimentary signals of the write data, whose drains are respectively connected to the power supply line via the resistors, and which sources are connected to a common source node, a third MOS transistor whose gate receives the control signal, and whose drain is connected to the common emitter node, a fourth MOS transistor whose gate receives an inverted signal of the control signal, and whose drain is connected to the common source node, a fifth MOS transistor whose gate receives an inverted signal of the register clock signal, whose drain is connected to sources of the third and fourth MOS transistors, and whose source is connected to a ground line, third and fourth bipolar transistors whose bases are respectively connected to the collectors of the first and second bipolar transistors, whose collectors are respectively connected to the power supply line, and which emitters are respectively connected to the ground line via constant current sources, the selected data being outputted from the emitters of the third and fourth bipolar transistors, fifth and sixth bipolar transistors whose collectors are respectively connected to the collectors of the first and second bipolar transistors, whose emitters are respectively connected to the emitters of the third and fourth bipolar transistors, and which emitters are connected in common to each other, and a sixth MOS transistor whose gate receives the register clock signal, whose drain is connected to the emitters of the fifth and sixth MOS transistors, and whose source is connected to the ground line.

In order to achieve another aspect of the present invention, a method of reading out a correct data in a semiconductor memory device, includes the steps of:

holding a write address;

holding a write data;

comparing an inputted read address and the write address to generate a selection control signal in an inactive level when the read address and the write address are not coincident with each other;

reading a read data from a memory cell array in accordance with the read address; and selecting and outputting the read data in response to the selection control signal in the inactive level and a register clock signal.

In order to achieve still another aspect of the present invention, a semiconductor memory device, includes a memory cell array composed of a plurality of memory cells, for storing a read data, a first holding circuit for holding a write address, a second holding circuit for holding a write data, a comparing circuit for comparing an inputted read address and the write address to generate a selection control signal in an inactive level when the read address and the write address are not coincident with each other, a read circuit for reading the read data from the memory cell array in accordance with the read address, and a data output section for selecting and outputting the read data in response to the selection control signal in the inactive level and a register clock signal.

BRIEF DESCRIPTION OF THE DRAWINGS

FIGS. 7A to 7J are time charts illustrating the operation of the semiconductor memory integrated circuit of the embodiment of the present invention.

DESCRIPTION OF THE PREFERRED EMBODIMENTS

Next, a semiconductor memory integrated circuit of the present invention will be described below in detail with reference to the accompanying drawings.

Figure 1:
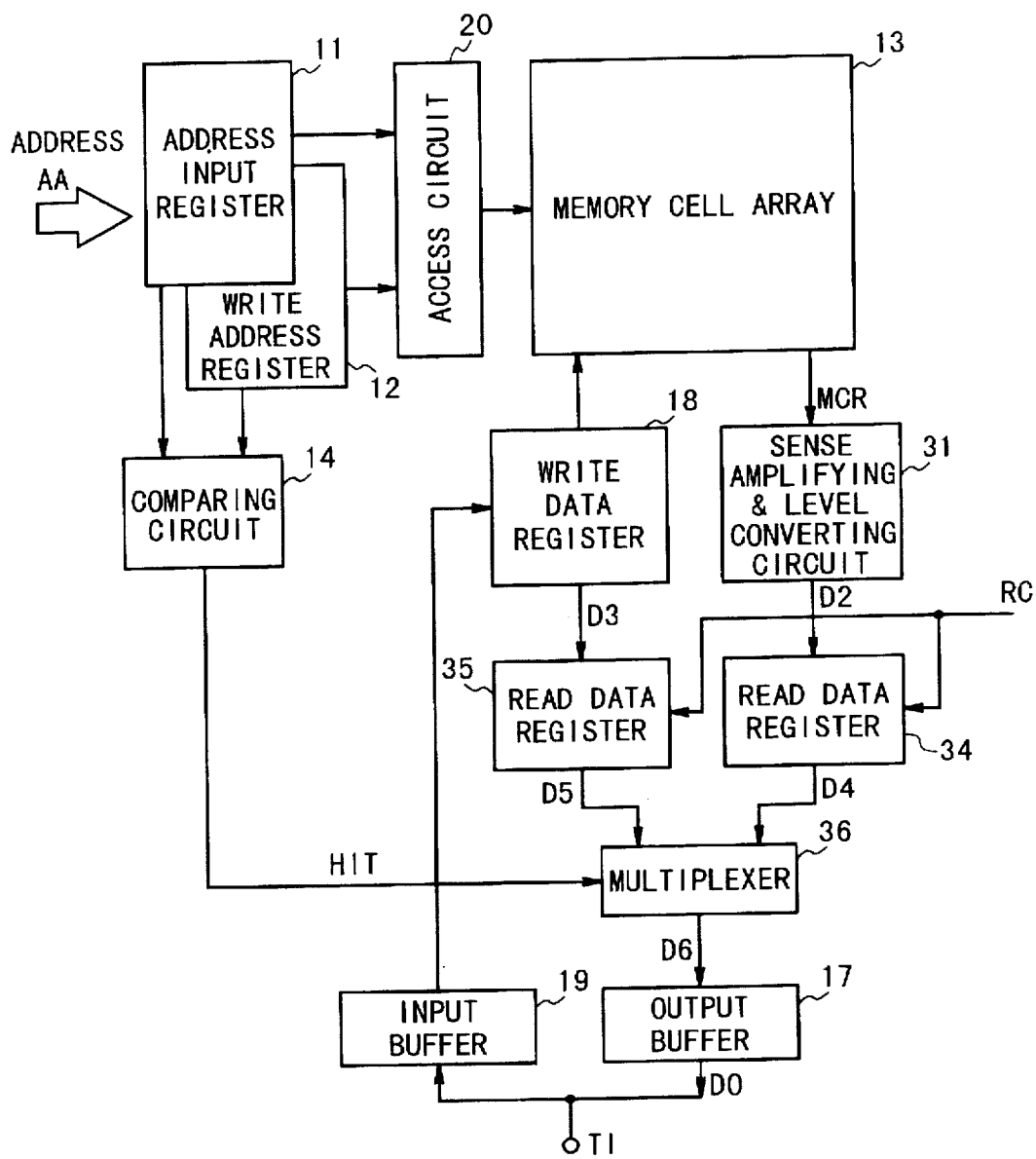
FIG. 1 is a block diagram illustrating the structure of a first conventional semiconductor memory integrated circuit.
Figure 2:
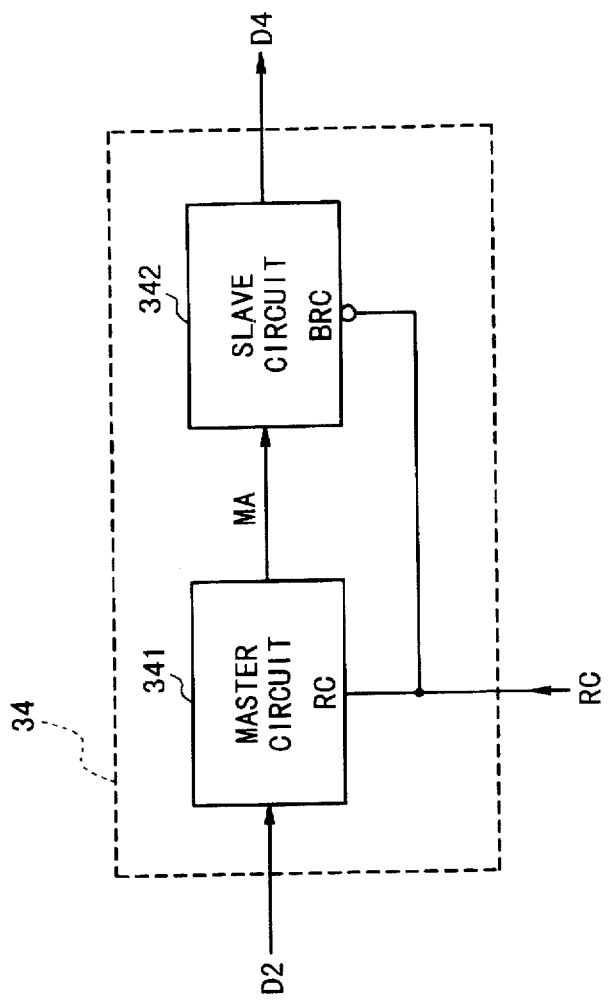
FIG. 2 is a block diagram illustrating the structure of a read data register 34 of FIG. 1.
Figure 4:
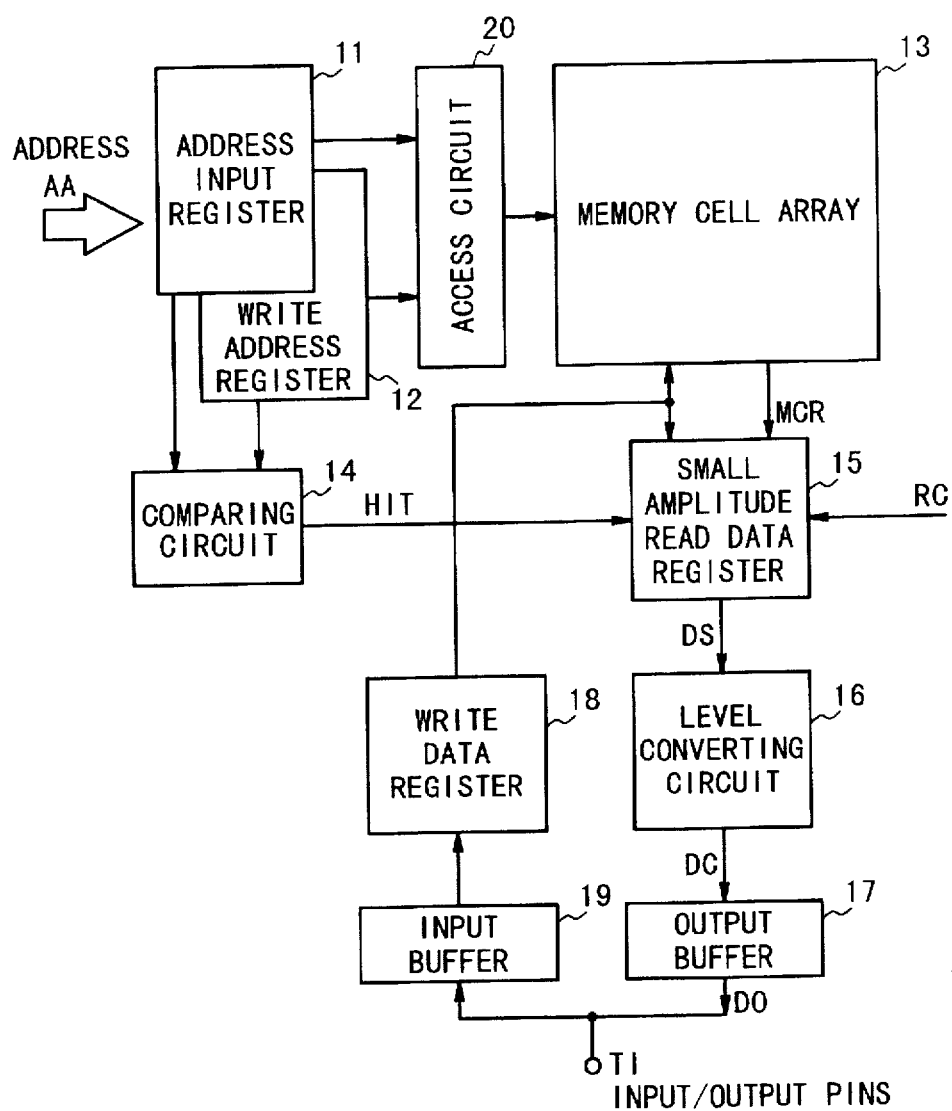
FIG. 4 is a block diagram illustrating the structure of a semiconductor memory integrated circuit according to an embodiment of the present invention.

FIG. 4 is a block diagram illustrating the structure of the semiconductor memory integrated circuit according to the first embodiment of the present invention. In FIG. 4, the same components as those shown in FIG. 1 are assigned with the same reference numerals.

Referring to the block diagram of FIG. 4, the semiconductor memory integrated circuit in the first embodiment is composed of an address input register 11, a write address register 12, a memory cell array 13, an access circuit 20, and a comparing circuit 14. The semiconductor memory integrated circuit is also composed of a write data register 18, an output buffer 17, an input buffer 19, a small amplitude read data register 15 with a multiplexer function, and a level converting circuit 16.

The address input register 11 temporarily holds an input address and the write address register 12 temporarily holds an input write address. The comparing circuit 14 compares the content of the address input register 11 and that of the write address register 12 to generate an active coincidence signal HIT when both of the contents are coincident with each other. The memory cell array 13 composed of a plurality of memory cells which are arranged in a matrix manner and store a read data. The write data register 18 stores a write data. The access circuit 20 read-accesses the memory cell array 13 based on the input address stored in the address input register 11 and write-accesses the memory cell array 13 based on the write address and the write data stored in the write data register 18.

The small amplitude read data register 15 receives the coincidence signal HIT from the comparing circuit 14 and a register clock signal RC to select one of the write data from the write data register 18 and the read data from the memory cell array 13. Also, the small amplitude read data register 15 amplifies the read data having a small amplitude from the memory cell array 13. The level converting circuit 16 converts a small amplitude level data signal from the read data register 15 into an output data signal of a MOS level. The output buffer 17 outputs the output data signal from the level converting circuit 16 via input/output pins TI. The input buffer 19 receives the write data via the input/output pins TI to transfer to the write data register 18.

Figure 5:
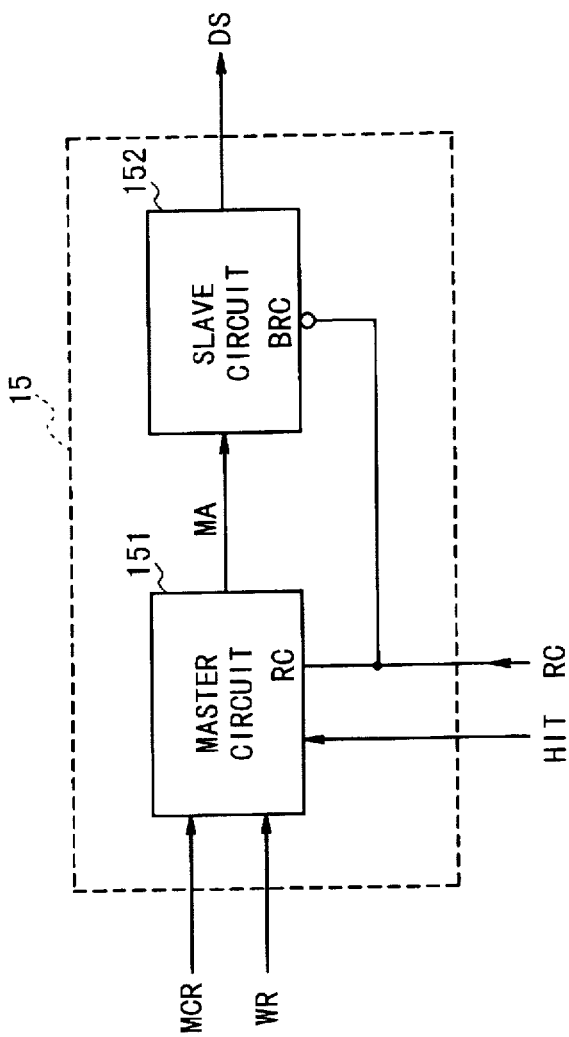
FIG. 5 is a block diagram illustrating the structure of a small amplitude read data register of FIG. 4.

FIG. 5 is a block diagram illustrating the structure of the small amplitude read data register 15. Referring to the block diagram of FIG. 5, the small amplitude read data register 15 is composed of a master circuit 151 for taking the write data WR from the write data register 18 or the read data MCR from the memory cell array 13 in response to the coincidence signal HIT and the register clock signal RC, and a slave circuit 152 for holding the data taken by the master circuit 151 in response to an inverted signal BRC of the register clock signal RC.

Figure 6:
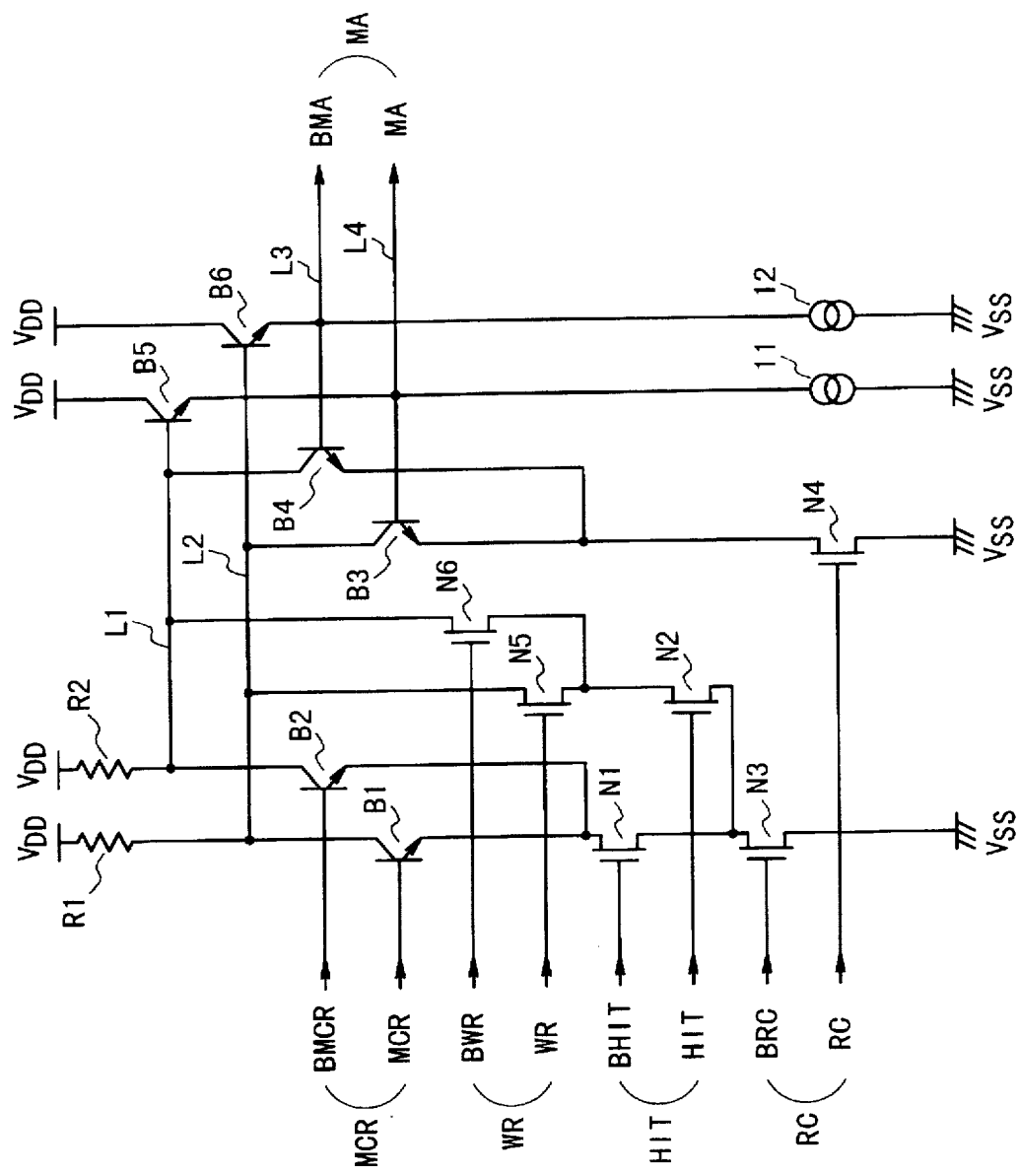
FIG. 6 is a circuit diagram illustrating the structure of a master circuit of FIG. 5.

FIG. 6 is a circuit diagram illustrating the master circuit 151. Referring to FIG. 6, the master circuit 151 receives 4 pairs of input signals and the input signals of each of the 4 pairs are complementary signals, respectively. That is, the read data signal MCR from the memory cell array 13 is composed of small amplitude complementary signals MCR and BMCR (signal BMCR is an inverted signal of the signal MCR, and the same can be said in the following description). The output signal WR of the write data register 18 is composed of complementary signals WR and BWR with a MOS level amplitude. Further, the coincidence signal HIT from the comparing circuit 14 is composed of complementary signals HIT and BHIT with the MOS level amplitude. In addition, a register clock RC is composed of complementary signals RC and BRC with the MOS level amplitude. The master signal MA is an output signal of the master circuit 151 with the multiplexer function and is composed of complementary signals MA and BMA with a small amplitude.

The master circuit 151 is composed of NPN bipolar transistors B1 to B6, N-channel MOS transistors N1 to N6, resistors R1 and R2, and constant current sources I1 and I2. The bipolar transistors B1 and B2 constitutes a differential pair. The bases of the bipolar transistors B1 and B2 receive the signals MCR and BMCR, and the collectors thereof are connected to the power supply $V_{DD}$ via the resistors R1 and R2, respectively. The collectors outputs are L1 and L2, respectively. The emitters of the bipolar transistors B1 and B2 are connected in common to the drain of the MOS transistor N1 via a common emitter node. The signal BHIT is supplied to the gate of the MOS transistor N1.

The drains of the MOS transistors N5 and N6 are connected to the outputs L1 and L2 and the sources thereof are connected in common to the drain of the MOS transistor N2 via a common source node, respectively. The signals MR and BWR are supplied to the gates of the MOS transistors N5 and N6, respectively. The signal HIT is supplied to the gate of the MOS transistor N2. The source of the MOS transistor N2 as well as the source of the MOS transistor N1 is connected to the drain of the MOS transistor N3. The signal BRC is supplied to the gate of the MOS transistor N3. The source of the MOS transistor N3 is connected to the ground potential.

The collectors of the bipolar transistors B3 and B4 are connected to the output L2 and L1, respectively. The signal MA and BMA are supplied to the bases of the bipolar transistors B3 and B4, respectively. The emitters of the bipolar transistors are connected in common to the drain of the MOS transistor N4. The signal RC is supplied to the gate of the MOS transistor N4. The source of the MOS transistor N4 is connected to the ground potential. The collectors of the bipolar transistors B5 and B6 are connected to the power supply voltage $V_{DD}$ and the bases thereof are connected to the outputs L1 and L2, respectively. The emitters of the bipolar transistors B5 and B6 as well as the bases of the bipolar transistors B3 and B4 are connected to the ground potentials via the constant current sources I1 and I2, respectively.

Next, the basis operation of the semiconductor memory integrated circuit in the first embodiment will be described with reference to FIG. 4.

Like the conventional example, in the semiconductor memory integrated circuit of this embodiment, a write operation to a memory cell of the memory cell array 13 is completed using two write cycles for a high-speed operation. In the first write cycle, a write address and a write data are taken in and held in the write address register 12 and the write data register 18, respectively. Then, the write operation of the write data to the memory cell is executed in the second write cycle. There may be N read cycles (N is an integer equal to or more than 0) between the first and second write cycles. In addition, in this second write cycle, a new write address and a new write data are taken in and held in the write address register 12 and the write data register 18, respectively. Therefore, when a read access to a memory cell of the memory cell array 13 having the write address which has been taken in the first write cycle is executed between the first and second write cycles, the read operation is performed to not the memory cell which stores an old erroneous data but the write data register 18 which stores the new correct write data.

Next, the operation of the semiconductor memory integrated circuit in this embodiment will be described in detail with reference to time charts of FIGS. 7A to 7I. It is assumed that a write address A1 and a write data D(A1) are taken in the write address register 12 and the write data register 18 in the first write cycle, respectively.

First, the normal read access to a memory cell will described. An address A0 is inputted in the address input register 11 in a cycle 0 as shown in FIG. 7A, and the access circuit 20 accesses the memory cell having the address A0. As a result, an effective read data Q(A0) is outputted on a signal line MCR in a time t1, as shown in FIG. 7C. The small amplitude read data register 15 reads the read data Q(A0) therein.

In this case, because the read address A0 is not coincident with the write address in the write address register 12, the coincidence signal HIT is left in the L level. In response to the L level of this coincidence signal HIT, the small amplitude read data register 15 selects the read data on the signal line MCR, i.e., the effective read data Q(A0) from the memory cell. This data Q(A0) is taken in the master circuit 151 in the through state at a time t3 and outputted onto the master signal line MA, as shown in FIG. 7G.

Next, in response to transition of the register clock signal RC to the H level in a time t2 which is shown in FIG. 7E, the effective data Q(A0) is taken in the slave circuit 152 in a time t4, as shown in FIG. 7H.

After that, the level converting circuit 16 converting the amplitude of the read data Q(A0) from the small amplitude read data register 15 into the MOS level and outputs on the signal line DC in a time t5, as shown in FIG. 7I. In a time t6, the output buffer 17 outputs the read data Q(A0) supplied on the signal line DC from the level converting circuit 16 to the input/output pin T1 as the output D0, as shown in FIG. 7J.

Next, referring to FIG. 5 in addition to FIGS. 7A to 7J, the operation of the small amplitude read data register 15 will be described in detail. The master circuit 151 is composed of a latch function, and set to the through state when the register clock signal RC is in an (inactive) L level and a holding state when the register clock signal RC is in an (active) H level.

Also, the slave circuit 152 is composed of a latch function in the same way. However, the slave circuit 152 is set to the through state when the register clock signal RC is in the H level and the holding state when the register clock signal RC is in the L level, opposite to the master circuit 151.

The coincidence signal HIT generated by the comparing circuit 14 is in the (active) H level when the address stored in the address input register 11 is coincident with the write address stored in the write address register 12, and is in the (inactive) L level, when the address stored in the address input register 11 is not coincident with the write address stored in the write address register 12.

First, the small amplitude read data Q(A0) from memory cell array 13 in the time t1 is taken in the master circuit 151 in the through state in the time t3, as shown in FIG. 7C. In response to the transition of the register clock RC from the L level to the H level, the master circuit 151 is set to the holding state of data Q(A0) in the time t2. The slave circuit 152 takes therein the read data Q(A0) on the master output line MA in the time t4, as shown in FIG. 7H. The read data Q(A0) is outputted to the level converting circuit 16 via the output line DS.

Next, the operation of the master circuit 151 will be described in detail with reference to FIG. 6.

First, when the address of address input register 11 is not coincident with the write address of write address register 12, the coincidence signal HIT is in the L level. Therefore, the signal BHIT is in the H level. As a result, the MOS transistor N1 is activated such that the small amplitude read data on the signal lines MCR and BMCR which are the output of the memory cell array 13. Also, at this time, since the MOS transistor N2 is in the inactive state, the write data on signal lines WR and BWR from the write data register 18 are not selected.

When the register clock signals RC and BRC in the L level and the H level, respectively, the MOS transistor N3 is activated. Also, the MOS transistor N4 is set in the inactive state. That is, the master circuit 151 is in the through state. Therefore, the read data on the signal lines MCR and BMCR are outputted to the slave circuit 152 by the bipolar transistors B5 and B6 just as they are, as the output signals MA and BMA of the master circuit 151.

After that, when the register clock signals RC and BRC change into the H level and the L level, respectively, the MOS transistor N4 is activated such that the master circuit 151 is set to the holding state. On the other hand, the MOS transistor N3 is set to the inactive state. Therefore, input to the master circuit 151 of the data on the signal lines MCR and BMCR is blocked off.

The bipolar transistors B3 and B4 which are activated by the MOS transistor N4 in the activation state. Therefore, the output data MA of the master circuit 151 is held by the bipolar transistors B5 and B6 which are always activated by the constant current sources I1 and I2.

Figure 3:
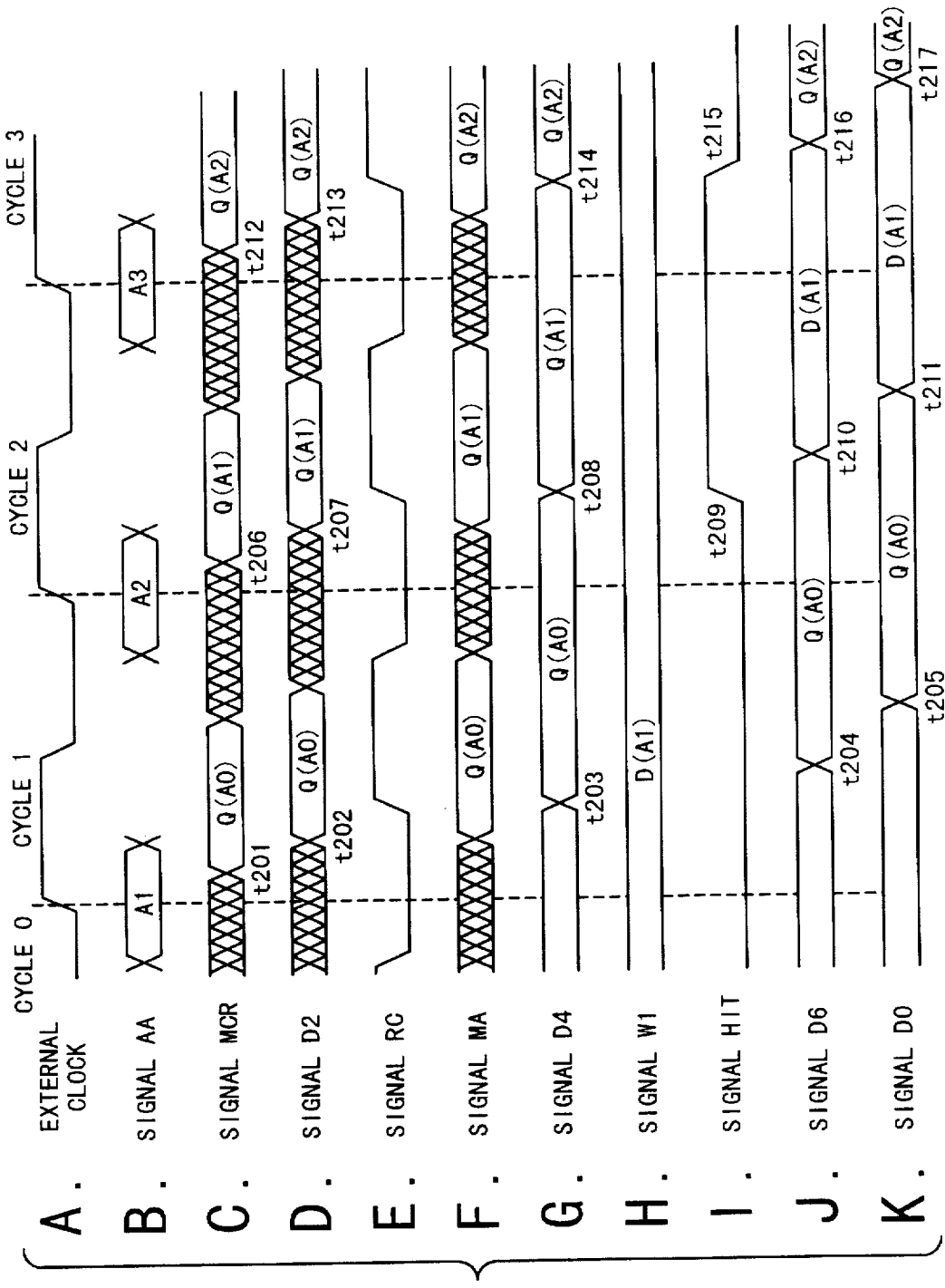
FIGS. 3A to 3K are time charts illustrating the operation of the first conventional semiconductor memory integrated circuit.

Next, the read access from the write data register 18 will be described with reference to FIG. 4 once again. In this case, the latest write data D(A1) is not yet written in the memory cell of the memory cell array 13 having the address A1 which is accessed in the first write cycle. The write data register 18 holds the correct write data D(A1). Irrespective of this, access to the memory cell of the memory cell array 13 having the address A1 is performed. Thus, invalid data Q(A1) is outputted on the signal line MCR in a time t7, as shown in FIG. 3C.

In this case, the coincidence signal HIT is in the H level since the address stored in the address input register 11 is coincident with the write address stored in the write address register 12. Therefore, the small amplitude read data register 15 does not select the invalid data Q(A1) on the signal line MCR but selects an effective data D(A1) on the output signal line WR from the write data register 18. In other words, the master circuit 151 in the through state takes the effective data D(A1) therein in a time t10 since the coincidence signal HIT is set to the H level in a time t9. Then, the master circuit 151 outputs the effective data D(A1) to the slave circuit 152 on the output signal MA. The slave circuit 152 takes the effective data D(A1) in a time t11 when the register clock signal RC is set to the H level in a time t8.

After that, the level converting circuit 16 converts this effective data D(A1) from the small amplitude level into the MOS level and outputs on the signal line DC in a time t12. The output buffer 17 outputs the data D(A1) to the input/output pins TI in a time t13.

Referring to FIG. 5 once again, the small amplitude read data from the memory cell array 13 appears on the signal line MCR in the time t7. Since the coincidence signal HIT is previously activated in the time t9, the small amplitude read data register 15 selects the write data D(A1) from the write data register 18 on the signal line WR. This data signal D(A1) is taken in by the master circuit 151 in the through state in the time t10. The master circuit 151 is set to the holding state of D(A1) in response to transition of the register clock signal RC from the L level to the H level in the time t8. The data D(A1) on the master signal line MA is taken in by the slave circuit 152 in the time t11, and is outputted to the level converting circuit 16 via the signal line DS.

The above operation will be described in detail with reference to FIGS. 7A to 7J.

When the input address stored in the address input register 11 is coincident with the write address stored in the write address register 12, the coincidence signal HIT is set to the H level, and the signal BHIT is set to the L level in the time t9, as shown in FIG. 7F. As a result, the MOS transistor N2 is activated to select the write data on the input signal lines WR and BWR. Also, since the MOS transistor N1 is set to the inactive state at this time not to select the read data on the input signal lines MCR and BMCR.

When the register clock signal RC changes to the L level and the signal BRC changes to the H level as shown in FIG. 7E, the MOS transistor N3 is activated and also the MOS transistor N4 is set in the inactive state. Therefore, the master circuit 151 becomes the through state. At this time, the write data on the signal lines WR and BWR are outputted just as they are in the time t10 as the output signals MA and BMA from the master circuit 151 as shown in FIG. 7G.

After that, when the register clock RC changes to the H level and the signal BRC changes to the L level in the time t8 as shown in FIG. 7E, the MOS transistor N3 becomes the inactive state and the MOS transistor N4 is activated. Thus, the master circuit 151 is set to the holding state. Therefore, input of the signal WR and BWR to the master circuit 151 is blocked off.

The master data signals MA and BMA are held by the bipolar transistors B3 and B4 which are activated by the MOS transistor N4 in the active state, and the bipolar transistors B5 and B6 which are always activated by the constant current sources I1 and I2.

In this case, in order to avoid delay of the access time and a fault of the effective data width, the coincidence signal HIT must satisfy the following relation.

$$t9 < t8 \quad (3)$$

Also, the coincidence signal must satisfy the following relation in the same way.

$$t14 < t15 \quad (4)$$

That is, the coincidence signal HIT is sufficient to cover the active register clock signal for a time period longer than the active time period of the register clock signal RC. Therefore, the setting of the timing of the coincidence signal HIT is very easy even if a temperature margin and a voltage margin are considered.

Summarizing the above, when a read access to an address of a memory cell in which a data is not yet written is performed, the address is detected and a coincidence signal is generated. An old error data from the memory cell is blocked off immediately before the small amplitude read data register 15 with the multiplexer function. A new correct data which is held by the write data register 18 is taken in by the above small amplitude read data register 15. Then, the new data is outputted to the input/output pins TI via the output buffer 17.

In case of the read access in which the addresses are not coincident with each other, a read data from the above write data register 18 is blocked off, since the above coincidence signal is not generated. The read data from the above memory cell is outputted to the input/output pins TI.

Note that the main point of the present invention can be realized by the other structure composed only of the MOS transistors, in addition to above-mentioned embodiment.

As described above, according to the semiconductor memory integrated circuit of the present invention, either of the read data and the write data is selected in response to the coincidence signal, and the selected data is held. Therefore, the present invention can cope with all the read accesses by the single read data register.

Also, the register clock signal is supplied to the read data register. Therefore, the set and reset timings of the register clock signal RC and coincidence signal can be set easily. Also, increase of a chip area and a consumption current can be achieved. In addition, the drive capability of the register clock signal can be reduced.

Further, because it is easy to adjust the timing of the coincidence signal and the timing of the register clock signal, considering a temperature margin and a voltage margin, bad influence to an access time and an effective data width can be suppressed as low as possible.

What is claimed is:

1. A semiconductor memory device comprising:
    a first address register for storing an inputted address;
    a second address register for storing a write address for a write data;
    a comparing circuit for comparing the inputted address stored in said first address register and the write address stored in said second address register and for generating a control signal in accordance with the comparing result;
    a memory cell array composed of a plurality of memory cells;
    a write data register for storing the write data; and
    a data output register for selectively receiving, as a selected data, one of the write data from said write data register and a read data from said memory cell array in response to the control signal and a register clock signal, and for outputting the selected data in response to the register clock signal.

2. A semiconductor memory device according to claim 1, wherein said data output register includes a sense amplifier function to amplify the read data from said memory cell array.

3. A semiconductor memory device according to claim 2, wherein said data output register includes:
    a differential transistor pair composed of a pair of bipolar transistors whose collectors are connected to a first power supply line, whose bases receive complimentary signals of the read data, and whose emitter are connected in common to each other.

4. A semiconductor memory device according to claim 1, wherein said comparing circuit generates the control signal in an active level when the inputted address stored in said first address register and the write address stored in said second address register are coincident with each other, and the control signal in an inactive level otherwise, and
    wherein said data output register includes a selecting circuit for selecting one of the write data and the read data in response to the control signal.

5. A semiconductor memory device according to claim 4, wherein said data output register includes:
    a first circuit section for receiving the read data;
    a second circuit section for receiving the write data;
    a first MOS transistor connected to said first circuit section and set to a conductive state when the control signal is in the inactive level and to a non-conductive state when the control signal is in the active level; and a second MOS transistor connected to said second circuit section and set to a conductive state when the control signal is in the active level and to a non-conductive state when the control signal is in the inactive level.

6. A semiconductor memory device according to claim 1, wherein said data output register includes a data holding circuit for holding and outputting the selected data in response to the register clock signal.

7. A semiconductor memory device according to claim 6, wherein said data output register includes:

a selecting circuit for selecting one of the write data and the read data in response to the control signal;

enabling means for enabling said selecting circuit to select one of the write data and the read data in response to the control signal when the register clock signal is in an inactive level; and holding means for holding the selected data in response to the register clock signal in an active level.

8. A semiconductor memory device according to claim 1, wherein said data output register includes:

a master circuit for selectively receiving one of the write data and the read data as the selected data in response to the control signal and the register clock signal in an inactive level, and holding the selected data in response to the register clock signal in an active level; and a slave circuit for holding the selected data from said master circuit in response to transition of the register clock signal to an active level.

9. A semiconductor memory device according to claim 8, wherein said control signal is set to an active level before the corresponding register clock signal is set to the active level when the inputted address and the write address are coincident with each other, and said control signal is reset to an inactive level before the register clock signal next to the corresponding register clock signal is set to the active level.

10. A semiconductor memory device according to claim 8, wherein said master circuit includes:

first and second bipolar transistors whose bases respectively receive complimentary signals of the read data, whose collectors are respectively connected to a power supply line via resistors, and which emitters are connected to a common emitter node;

first and second MOS transistors whose gates respectively receive complimentary signals of the write data, whose drains are respectively connected to the power supply line via the resistors, and which sources are connected to a common source node;

a third MOS transistor whose gate receives the control signal, and whose drain is connected to the common emitter node;

a fourth MOS transistor whose gate receives an inverted signal of the control signal, and whose drain is connected to the common source node;

a fifth MOS transistor whose gate receives an inverted signal of the register clock signal, whose drain is connected to sources of said third and fourth MOS transistors, and whose source is connected to a ground line;

third and fourth bipolar transistors whose bases are respectively connected to the collectors of said first and second bipolar transistors, whose collectors are respectively connected to the power supply line, and which emitters are respectively connected to the ground line via constant current sources, the selected data being outputted from the emitters of said third and fourth bipolar transistors;

fifth and sixth bipolar transistors whose collectors are respectively connected to said collectors of said first and second bipolar transistors, whose emitters are respectively connected to said emitters of said third and fourth bipolar transistors, and which emitters are connected in common to each other; and a sixth MOS transistor whose gate receives said register clock signal, whose drain is connected to said emitters of said fifth and sixth MOS transistors, and whose source is connected to said ground line.

11. A method of reading out a correct data in a semiconductor memory device, comprising the steps of:

holding a write address;

holding a write data;

comparing an inputted read address and the write address to generate a selection control signal in an inactive level when the read address and the write address are not coincident with each other;

reading a read data from a memory cell array in accordance with the read address; and selecting and outputting the read data in response to the selection control signal in the inactive level and a register clock signal.

12. A method according to claim 11, wherein said comparing step includes generating the selection control signal in an active level during a predetermined time period when the read address and the write address are coincident with each other, and wherein said step of selecting and outputting includes selecting and outputting the write data in response to the selection control signal in the active level and a register clock signal.

13. A method according to claim 12, wherein said selection control signal is set to the active level before the corresponding register clock signal is set to an active level when the inputted address and the write address are coincident with each other, and said control signal is reset to the inactive level before the register clock signal next to the corresponding register clock signal is set to the active level.

14. A method according to claim 12, wherein said selecting and outputting step includes:

selecting one of the read data and the write data as a selected data in response to the selection control signal;

allowing said selecting step in response to the register clock signal in an inactive level; and holding the selected data in response to the register clock signal in an active level subsequent to the inactive level.

15. A method according to claim 14, wherein said selecting step includes amplifying the read data when the read data is selected.

16. A semiconductor memory device, comprising:

a memory cell array composed of a plurality of memory cells, for storing a read data; first holding means for holding a write address;

second holding means for holding a write data;

comparing means for comparing an inputted read address and the write address to generate a selection control signal in an inactive level when the read address and the write address are not coincident with each other;

read means for reading the read data from said memory cell array in accordance with the read address; and data output means for selecting and outputting the read data in response to the selection control signal in the inactive level and a register clock signal.

17. A semiconductor memory device according to claim 16, wherein said comparing means includes generating the selection control signal in an active level during a predetermined time period when the read address and the write address are coincident with each other, and wherein said data output means includes means for selecting and outputting the write data in response to the selection control signal in the active level and a register clock signal.

18. A semiconductor memory device according to claim 17, wherein said selection control signal is set to the active level before the corresponding register clock signal is set to an active level when the inputted address and the write address are coincident with each other, and said control signal is reset to the inactive level before the register clock signal next to the corresponding register clock signal is set to the active level.

19. A semiconductor memory device according to claim 17, wherein said data outputting means includes:

selecting means for selecting one of the read data and the write data as a selected data in response to the selection control signal;

enabling means for enabling said selecting means in response to the register clock signal in an inactive level; and third holding means for holding the selected data in response to the register clock signal in an active level subsequent to the inactive level.

20. A semiconductor memory device according to claim 19, wherein said selecting means includes means for amplifying the read data when the read data is selected.

* * * * *